United States Patent
Hokazono et al.

(10) Patent No.: US 7,141,467 B2
(45) Date of Patent: Nov. 28, 2006

(54) SEMICONDUCTOR DEVICE HAVING METAL SILICIDE FILMS FORMED ON SOURCE AND DRAIN REGIONS AND METHOD FOR MANUFACTURING THE SAME

(75) Inventors: Akira Hokazono, Sagamihara (JP); Kazuya Ohuchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/759,205

(22) Filed: Jan. 20, 2004

(65) Prior Publication Data
US 2004/0183146 A1 Sep. 23, 2004

(30) Foreign Application Priority Data
Mar. 20, 2003 (JP) ............... 2003-077648

(51) Int. Cl.
*H01L 21/8238* (2006.01)
(52) U.S. Cl. ...................... 438/199; 438/682
(58) Field of Classification Search ........... 438/301, 438/305, 199, 682, 597, 527; 297/369, 385, 297/412, 357; 257/369, 385, 412, 357
See application file for complete search history.

(56) References Cited

U.S. PATENT DOCUMENTS 5,170,242 A * 12/1992 Stevens et al. ............ 257/751
6,235,568 B1 * 5/2001 Murthy et al. ............ 438/231
6,372,585 B1 * 4/2002 Yu .......................... 438/301
6,790,723 B1 * 9/2004 Tanaka et al. ............ 438/243

OTHER PUBLICATIONS

A.S.W. Wong, et al., "Enhanced Thermal Stability of NiSi Films on 20KEV BF$_2$ + Implanted (100) Si", Symposium B Silicon Material-Processing, Characterization and Reliability, MRS 2002 Spring Meeting, Apr. 1-5, 2002, 1 Page.
T. Ohguro, et al., "Analysis of Anomalously Large Junction Leakage Current of Nickel Silicided N-Type Diffused Layer and Its Improvement", Extended Abstracts of the 1993 International Conference on Solid State Devices and Materials, 1993 pp. 192-194.

* cited by examiner

*Primary Examiner*—Douglas W. Owens
(74) *Attorney, Agent, or Firm*—Oblon, Spivak, McClelland, Maier & Neustadt, P.C.

(57) ABSTRACT

A semiconductor device includes a p-type well region, n$^+$-type diffusion regions formed in the surface region of the p-type well region, a gate electrode containing silicon and formed above the p-type well region with a gate insulating film disposed therebetween, and NiSi films formed in the surface regions of the n$^+$-type diffusion regions. In the semiconductor device, p-type impurity is doped in the depth direction from the surface of the NiSi film and the impurity profile of p-type impurity is so formed that a peak concentration of not lower than 1E20 cm$^{-3}$ will be provided in a preset depth position of the NiSi film and the concentration in the interface between the NiSi film and the n$^+$-type diffusion region and the concentration in a position deeper than the interface will not be higher than 5E19 cm$^{-3}$.

15 Claims, 5 Drawing Sheets

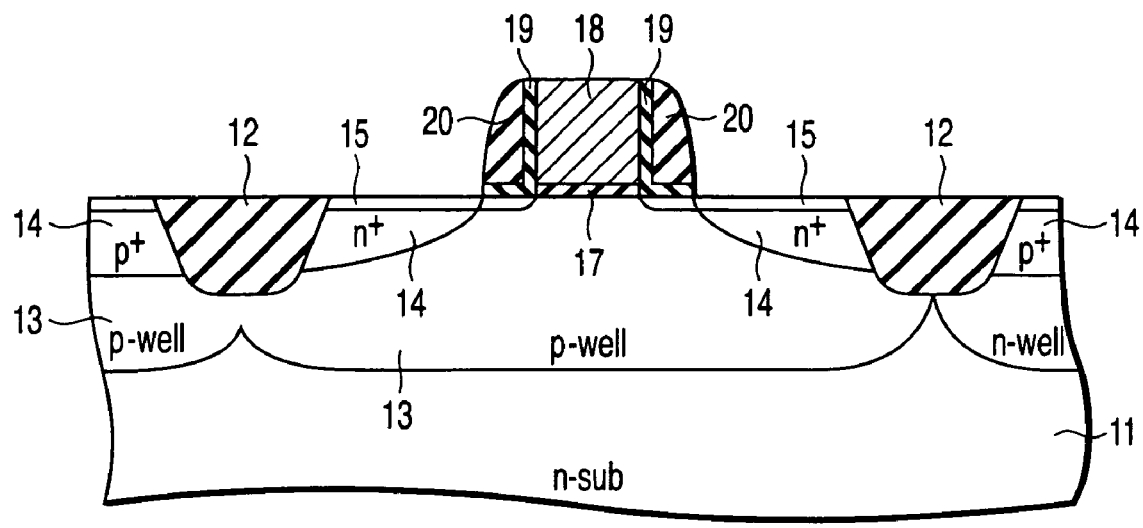
F I G. 4A
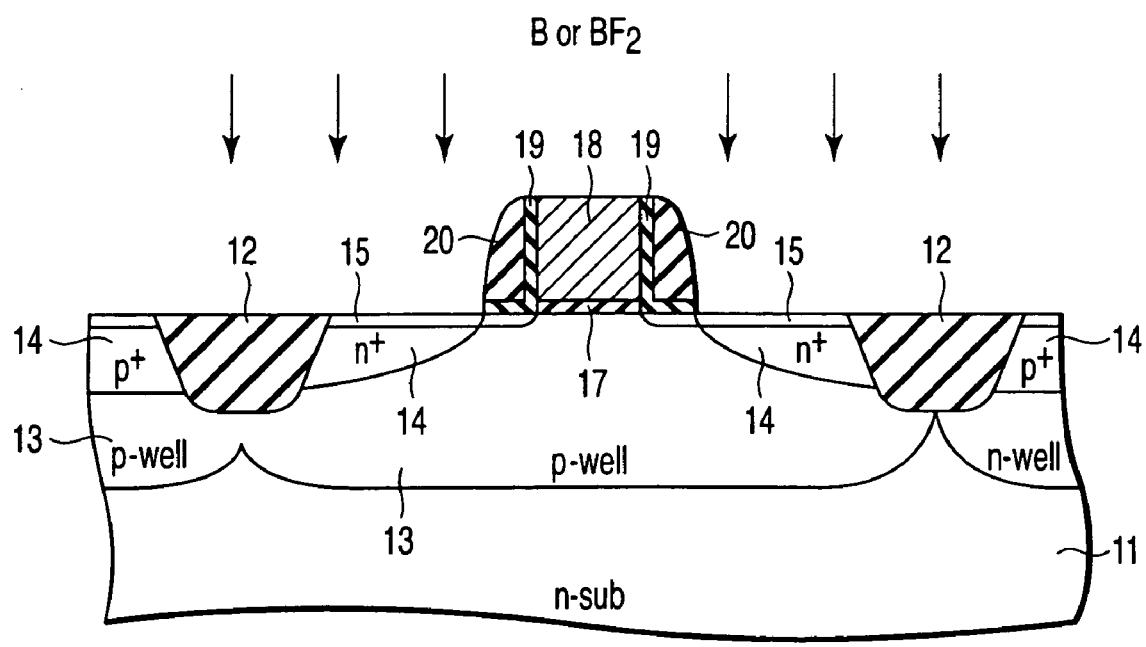
F I G. 4B

SEMICONDUCTOR DEVICE HAVING METAL SILICIDE FILMS FORMED ON SOURCE AND DRAIN REGIONS AND METHOD FOR MANUFACTURING THE SAME

CROSS-REFERENCE TO RELATED APPLICATIONS

This application is based upon and claims the benefit of priority from the prior Japanese Patent Application No. 2003-77648, filed Mar. 20, 2003, the entire contents of which are incorporated herein by reference.

BACKGROUND OF THE INVENTION

1. Field of the Invention

This invention relates to a semiconductor device having metal silicide films formed on a gate electrode and source and drain regions and a method for manufacturing the same.

2. Description of the Related Art

In a CMOS semiconductor device, metal silicide films, for example, Ni silicide films are formed in a self-alignment manner on the gate electrode and source and drain regions and the operation speed is enhanced by lowering the wiring resistances thereof. For example, this is disclosed in T. Ohguro et al. "Analysis of Anomalously Large Junction Leakage Current of Nickel Silicided N-type Diffused Layer and Its Improvement", Extended Abstracts of the 1993 International Conference on Solid-State Devices and Materials, 1993, pp. 192–194.

After formation of the Ni silicide films, contact holes which reach the source and drain regions are formed in an inter-level insulating film in order to form contact plugs. In a case where the contact holes are formed, the junction leakage characteristic will be degraded when the Ni silicide films and portions of the source and drain regions which lie under the Ni silicide films are etched by a reactive ion etching (RIE) process.

In order to prevent the junction leakage characteristic from being degraded, a method for forming a contact liner film having a high selective ratio with respect to the inter-level insulating film on the entire surface containing the silicide films before the inter-level insulating film is formed is used. Then, the etching process is performed in two stages, that is, the inter-level insulating film and the contact liner film are separately etched to form contact holes. Generally, a silicon nitride film is used as the contact liner film.

Particularly, in an NMOS transistor region of a CMOS semiconductor device, there occurs a problem that the Ni silicide films formed on the source and drain regions are liable to be etched at the stage of a wet process which is a process performed before formation of the contact liner film. If the Ni silicide film is etched, the sheet resistance of the Ni silicide film increases and junction leakage occurs. Further, the contact liner film formed on the Ni silicide films on the source and drain regions is liable to be separated. If the contact liner film is separated the separated contact liner film causes dust, thereby making it difficult to perform the integration process after this.

Thus, in a conventional CMOS semiconductor device, there occurs a problem that the Ni silicide films formed on the source and drain regions of the NMOS transistor region are liable to be etched. Further, there occurs a problem that the contact liner film formed on the Ni silicide films on the source and drain regions tends to be separated. Conventionally, it is desired to solve the above problems.

BRIEF SUMMARY OF THE INVENTION

According to a first aspect of the present invention, there is provided a semiconductor device comprises a p-type silicon semiconductor region, an n-type diffusion region formed in the surface region of the silicon semiconductor region, an Ni silicide film formed in the surface region of the n-type diffusion region, and a p-type impurity diffusion layer formed to extend from the surface of the Ni silicide film in the depth direction, wherein the p-type impurity diffusion layer has an impurity profile in which a peak concentration of not lower than $1E20$ $cm^{-3}$ is provided in a preset depth position of the Ni silicide film and the concentration in the interface between the Ni silicide film and the n-type diffusion region and in the position deeper than the interface is not higher than $5E19$ $cm^{-3}$.

According to a second aspect of the present invention, there is provided a manufacturing method of a semiconductor device comprises doping n-type impurity ions into a selected position of a surface region of a p-type silicon semiconductor region, doping p-type impurity ions into the entire surface region of the silicon semiconductor region, activating the n-type and p-type impurity ions to form an n-type diffusion region in the surface region of the silicon semiconductor region and form a p-type impurity diffusion layer in the depth direction of the silicon semiconductor region, and performing heat treatment to form an Ni silicide film on the surface region of the n-type diffusion region after depositing Ni on the surface of the n-type diffusion region, wherein the p-type impurity diffusion layer is formed after formation of the Ni silicide film to provide an impurity profile in which a peak concentration of not lower than $1E20$ $cm^{-3}$ is provided in a preset depth position of the Ni silicide film and the concentration in the interface between the Ni silicide film and the n-type diffusion region and the concentration in a position deeper than the interface are not higher than $5E19$ $cm^{-3}$.

BRIEF DESCRIPTION OF THE SEVERAL VIEWS OF THE DRAWING

FIGS. 4A and 4B are cross-sectional views showing parts of steps of a manufacturing method of a CMOS semiconductor device according to a third embodiment.

DETAILED DESCRIPTION OF THE INVENTION

There will now be described embodiments of this invention with reference to the accompanying drawings.

Figure 1:
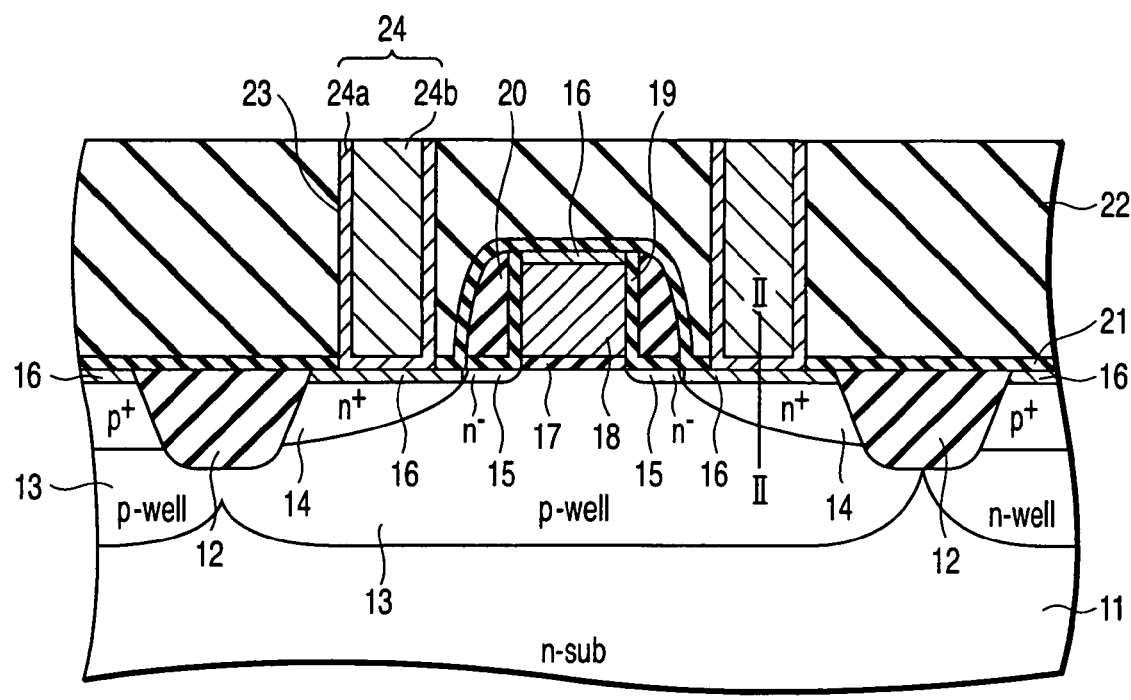
FIG. 1 is a cross-sectional view showing a CMOS semiconductor device according to a first embodiment of this invention.

FIG. 1 shows the cross-sectional structure of a CMOS semiconductor device according to a first embodiment of this invention. In FIG. 1, only an NMOS transistor region among the CMOS semiconductor device in which an NMOS transistor is formed is shown.

Element isolation insulating films 12 are formed on the surface region of a silicon substrate, for example, an n-type silicon substrate (n-sub) 11. The n-type silicon substrate 11 is divided into a plurality of element regions by the element isolation regions 12. A p-type well region (p-well) 13 or n-type well region (n-well) is formed in each of the element regions. Further, n-type impurity, for example, As (Arsenic) ions are diffused into the surface region of each of the p-type well regions 13 with a high concentration. Thus, a pair of n$^+$-type diffusion regions 14 which are used as source and drain regions of an NMOS transistor are formed and separated with a preset distance. A pair of n$^-$-type diffusion regions 15 into which an n-type impurity, for example, As ions are diffused with a concentration lower than that of the pair of n$^+$-type diffusion regions 14 are formed on the surface regions of the pair of n$^+$-type diffusion regions 14. The pair of n$^-$-type diffusion regions 15 have a diffusion depth shallower than that of the pair of n$^+$-type diffusion regions 14 and have an area larger than that of the pair of n$^+$-type diffusion regions 14. Generally, the pair of n$^+$-type diffusion regions 14 is called extension regions. NiSi films 16 are respectively formed on the surface regions of the pair of n$^-$-type diffusion regions 15. Further, a p-type impurity is diffused into the surface region of each n-type well region 13 with a high concentration. Thus, a pair of p$^+$-type diffusion regions which are used as source and drain regions of a PMOS transistor are formed and separated with a preset distance. Further, p$^+$-type diffusion regions used to form contacts are formed on the surface region of the p-type well region 13.

A gate insulating film 17 formed of SiO$_2$ (silicon oxide), SiON (silicon oxide-nitride), SiN (silicon nitride) or the like is formed on a portion of the substrate which lies between the pair of n$^-$-type diffusion regions 15. Further, a gate electrode 18 formed of, for example, polycrystalinesilicon germanium or polycrystalinesilicon whose resistance is lowered by doping an impurity therein, is formed on the gate insulating film 17. An NiSi film 16 is also formed on the upper surface region of the gate electrode 18.

Silicon nitride films 19 are formed on the side walls of the gate electrode 18 and on the surfaces of the n$^-$-type diffusion regions 15 around the gate electrode. Further, silicon oxide film 20 is formed on the silicon nitride film 19 formed on the side walls of the gate electrode 18.

A silicon nitride film 21 used as a contact liner film is formed on the entire surface of the substrate containing the gate electrode 18. An inter-level insulating film 22 formed of TEOS, BPSG, or SiN, for example, is deposited on the silicon nitride film 21. A pair of contact holes 23 which reach the surfaces of the NiSi films 16 on the source and drain regions are formed in the inter-level insulating film 22 and silicon nitride film 21. A contact electrode 24 is formed in each of the contact holes 23. The contact electrode 24 is formed of a barrier metal 24a formed of Ti/TiN, for example, and a contact plug 24b formed of W.

Further, B ions or BF$_2$ ions are doped as p-type impurities from the surface of the silicon substrate in the depth direction of the substrate and activated before formation of the NiSi films 16. The impurity profile along the II—II line in FIG. 1 is shown in FIG. 2.

Figure 2:
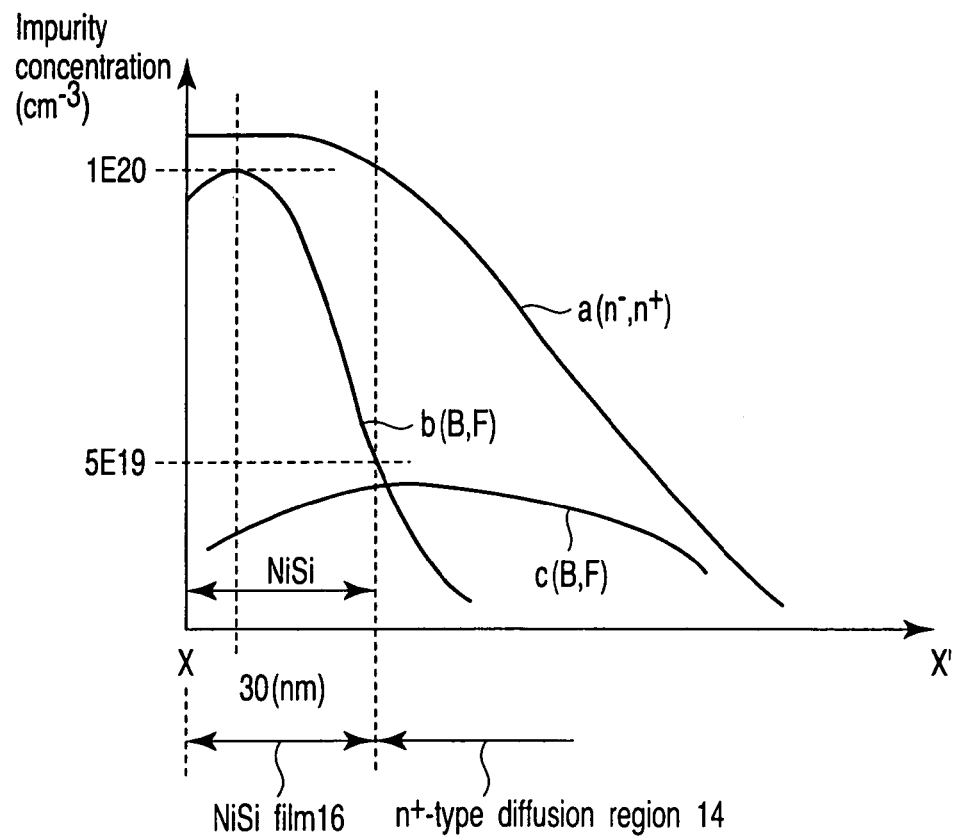
FIG. 2 is a diagram showing an impurity profile along the II—II line of FIG. 1.

In FIG. 2, a curve "a" indicates a variation in the impurity concentration of the n-type impurity of the n$^-$-type diffusion region 15 and n$^+$-type diffusion region 14, that is, As and a curve "b" indicates a variation in the impurity concentration of the p-type impurity of B or F.

Further, a curve "c" in FIG. 2 indicates a variation in the impurity concentration of the p-type impurity, for example, B or F which is previously doped into the substrate surface region in order to prevent the pair of n$^-$-type diffusion regions 15 from being short-circuited when the gate size, particularly, the gate width, is reduced by chip shrink. The impurity profile is generally called a Halo profile or Pocket profile.

In the semiconductor device of this embodiment, the p-type impurities of B ions or BF$_2$ ions are doped from the surface of the NiSi film 16 in the depth direction. As shown by the curve "b" of FIG. 2, the impurity profile of the p-type impurity is formed to have a peak concentration of not lower than 1E20 cm$^{-3}$ in a preset depth position of the NiSi film 16, for example, in a depth position at a distance of 30 nm from the substrate surface. Further, the impurity profile is formed to have a concentration of not higher than 5E19 cm$^{-3}$ in the interface between the NiSi film 16 and the n$^+$-type diffusion region 14 and in a position deeper than the interface.

In this case, the NiSi films 16 are formed on the n$^+$-type diffusion regions 14 containing the n-type impurity of As with high concentration. Therefore, a compound formed of As, Ni, and O is present in the NiSi film 16.

According to investigation by the inventors, the surface state of the NiSi film 16 becomes rough by the presence of the compound. As a result, it becomes clear that the NiSi film 16 is liable to be etched when the inter-level insulating film 22 is etched and the silicon nitride film 21 formed as the contact liner film formed on the NiSi film 16 is liable to be separated.

In the semiconductor device of this embodiment, the p-type impurity of B or F is doped from the surface of the NiSi film 16 in the depth direction and B or F is present in the surface region of the NiSi film 16. Therefore, formation of the compound formed of As, Ni, and O as described before is suppressed in the NiSi film 16, and as a result, the surface state of the NiSi film 16 can be improved. Thus, it becomes difficult to etch the NiSi film 16 when the inter-level insulating film 22 is etched and separation of the silicon nitride film 21 used as the contact liner film formed on the NiSi film 16 can be suppressed.

Further, the p-type impurity of B or F is doped to provide a peak concentration of not lower than 1E20 cm$^{-3}$ in a position at a distance of 30 nm from the surface of the NiSi film 16. Therefore, the surface state of the NiSi film 16 can be improved to attain the anti-etching property of the NiSi film 16 and the effect of prevention from separation of the silicon nitride film 21 used as the contact liner film formed on the NiSi film 16 to a fully satisfactory degree.

In addition, the p-type impurity of B or F is doped so that the impurity concentration in the interface between the NiSi film 16 and the n$^+$-type diffusion region 14 and in a position deeper than the interface will not become higher than 5E19 cm$^{-3}$. Therefore, the n-type impurity concentration in the n$^+$-type diffusion region 14 lying under the NiSi film 16 can be kept sufficiently high and the resistance of the interface between the NiSi film 16 and the n$^+$-type diffusion region 14 can be lowered. By lowering the interface resistance, a rise in the parasitic resistances of the source and drain regions can be prevented.

Next, a manufacturing method of the first embodiment when the semiconductor device of FIG. 1 is manufactured is explained.

Figure 3A:
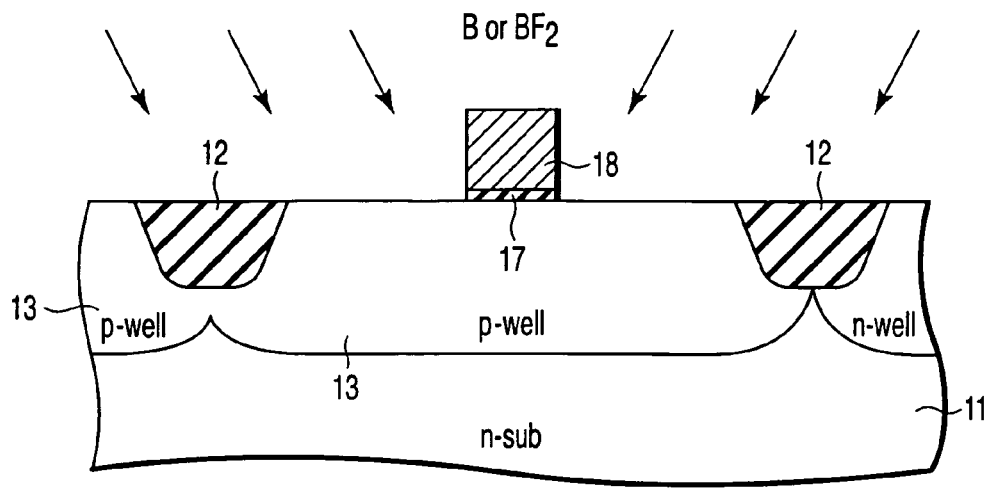
FIGS. 3A to 3I are cross-sectional views sequentially showing the steps of a manufacturing method of the CMOS semiconductor device according to the first embodiment.

First, as shown in FIG. 3A, element isolation insulating films 12 with a depth of 200 to 350 nm are formed on the surface region of a silicon substrate, for example, an n-type silicon substrate (n-sub) 11, by the buried method. The n-type silicon substrate 11 is divided into a plurality of element regions by the presence of the element isolation insulating films 12. After this, a silicon oxide film with a film thickness of 20 nm or less is formed on the entire surface.

Then, p-type/n-type well regions are formed, ions are implanted and the RTA (rapid thermal oxidation) process is performed to form the channel regions of n-channel/p-channel MOS transistors. As a typical ion implantation condition, P (phosphorus) ions are doped into the portion in which the n-type well region is formed with an acceleration voltage of 500 keV and a dose amount of $3.0E13$ cm$^{-2}$. Further, B (boron) ions are doped into the channel region of the PMOS transistor formed in the n-type well region with an acceleration voltage of 10 keV and a dose amount of $1.5E13$ cm$^{-2}$. B ions are doped into the portion in which the p-type well region is formed with an acceleration voltage of 260 keV and a dose amount of $2.0E13$ cm$^{-2}$. Further, As (arsenic) ions are doped into the channel region of the NMOS transistor formed in the p-type well region with an acceleration voltage of 100 keV and a dose amount of $1.5E13$ cm$^{-2}$. In the following explanation, only the manufacturing process associated with an NMOS transistor region in which an NMOS transistor is formed is explained. However, a PMOS transistor is formed in a PMOS transistor region in a similar manner.

Next, a gate insulating film 17 formed of a silicon oxide film with a film thickness of 1 to 6 nm is newly formed by the thermal oxidation method or low-pressure chemical vapor deposition (LP-CVD) method after the silicon oxide film is removed. Then, a polycrystalinesilicon film or polycrystalinesilicon germanium film with a film thickness of 50 to 200 nm is deposited on the entire surface. After this, for example, the above film is patterned to have a width of 10 to 150 nm, for example, by use of a photolithography process, X-ray lithography process or electron beam lithography process. Then, a gate electrode 18 is formed by selectively etching the polycrystalinesilicon film or polycrystalinesilicon germanium film by RIE.

Next, in order to form a Halo profile described before, B ions or BF$_2$ ions are doped into the entire surface region in an oblique direction.

In the above explanation, a case wherein the gate insulating film 17 is formed of SiO$_2$ (silicon oxide) is explained. However, it is also possible to form the insulating film by use of an SiON (silicon oxide-nitride) film, SiN (silicon nitride) film, Ta$_2$O$_5$ film which is a ferroelectric film, or the like. Further, the gate electrode 18 can be formed with a metal gate structure in which TiN, WN are used as a barrier metal and W is laminated on the barrier metal instead of the polycrystalinesilicon film or polycrystalinesilicon germanium film.

Figure 3B:
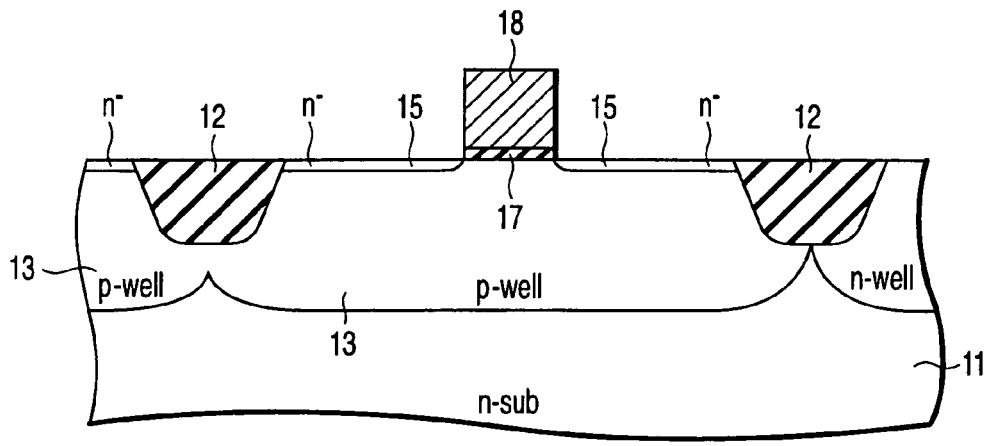

Then, after a silicon oxide film is formed with a film thickness of 1 to 6 nm as a post-oxidation film by the thermal oxidation method, a pair of n$^-$-type diffusion regions 15 are formed on the surface region of the p-type well region 13 as shown in FIG. 3B. The n$^-$-type diffusion regions 15 are formed by doping As ions, for example, with an acceleration voltage of 1 to 5 keV and a dose amount of $5.0E14$ to $1.5E15$ cm$^{-2}$ and then performing the RTA process.

Figure 3C:
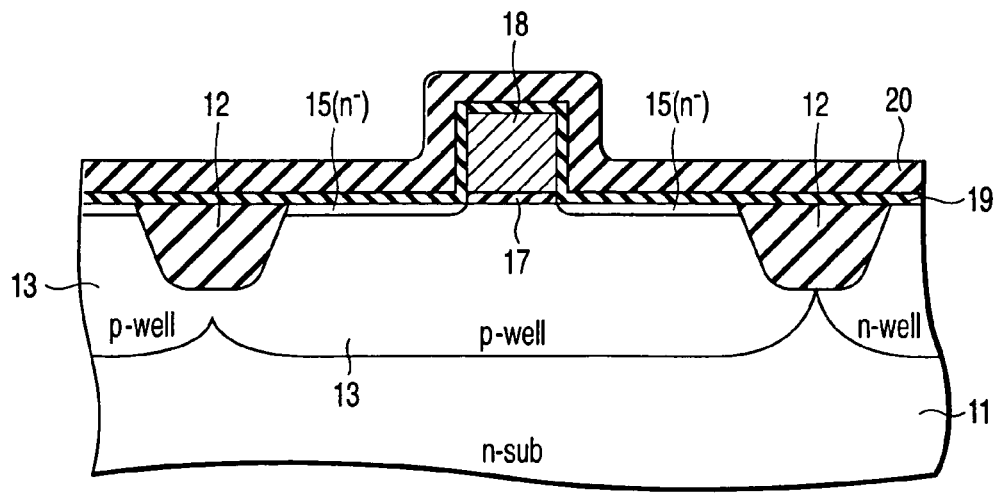

Next, as shown in FIG. 3C, a silicon nitride film 19 is deposited on the entire surface by the LP-CVD method and then a silicon oxide film 20 is deposited.

Figure 3D:
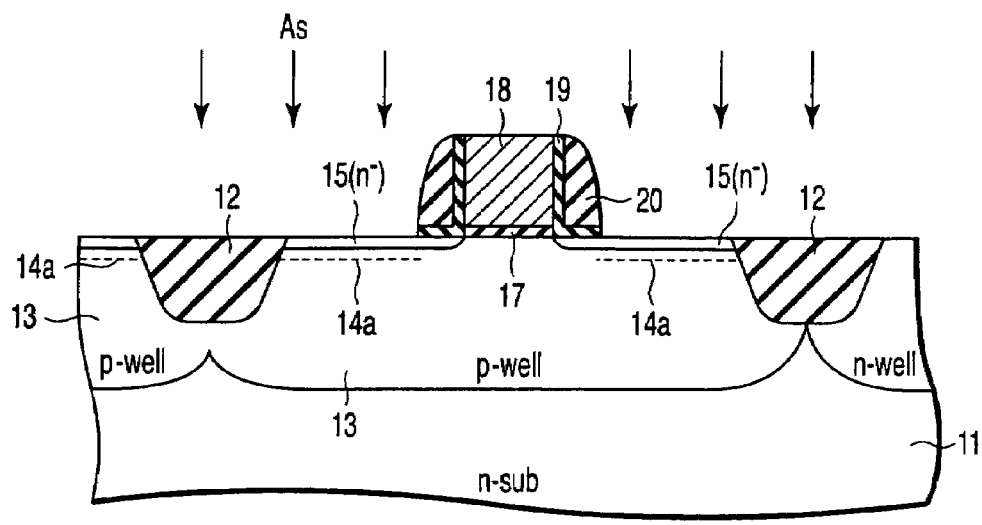

After this, the silicon oxide film 20 and silicon nitride film 19 are etched back by anisotropic etching by use of the RIE method. Thus, as shown in FIG. 3D, the silicon nitride film 19 is left behind in a continuous form on part of the surface of the n$^-$-type diffusion regions 15 which lies on and around the side walls of the gate electrode 18. Further, the silicon oxide films 20 are left behind on parts of the silicon nitride film 19 which lie on the side walls of the gate electrode 18. Then, for example, As ions are ion-implanted as n-type impurities into the p-type well region 13 with the gate electrode 18 used as a mask to from ion-implantation regions 14a which are used to form n$^+$-type diffusion regions 14.

Figure 3E:
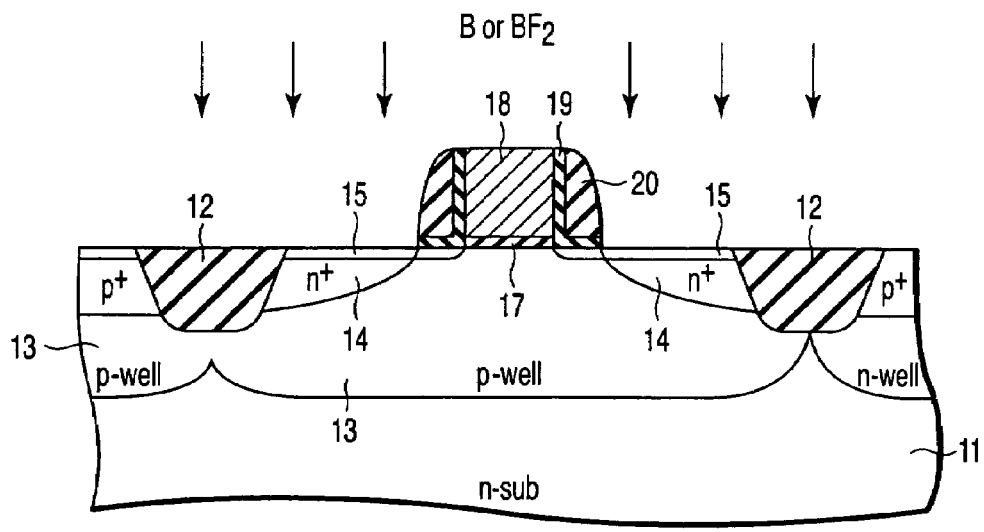

Next, as shown in FIG. 3E, for example, B or BF$_2$ ions are implanted as p-type impurities into the entire surface portion of the NMOS transistor region. In this case, the implantation condition when the B ions are used as the p-type impurities is that the acceleration voltage is 0.5 to 1.5 keV and the dose amount is $5.0E14$ to $1.0E15$ cm$^{-2}$, for example. Further, when the BF$_2$ ions are used, the acceleration voltage is 5 to 10 keV and the dose amount is $5.0E14$ to $1.0E15$ cm$^{-2}$. After this, the RTA process is performed to activate the ions implanted into the ion implantation regions 14a and form the pair of n$^+$-type diffusion regions 14. At this time, the B or BF$_2$ ions are activated to attain the impurity profile as shown by the curve "b" of FIG. 2.

Figure 3F:
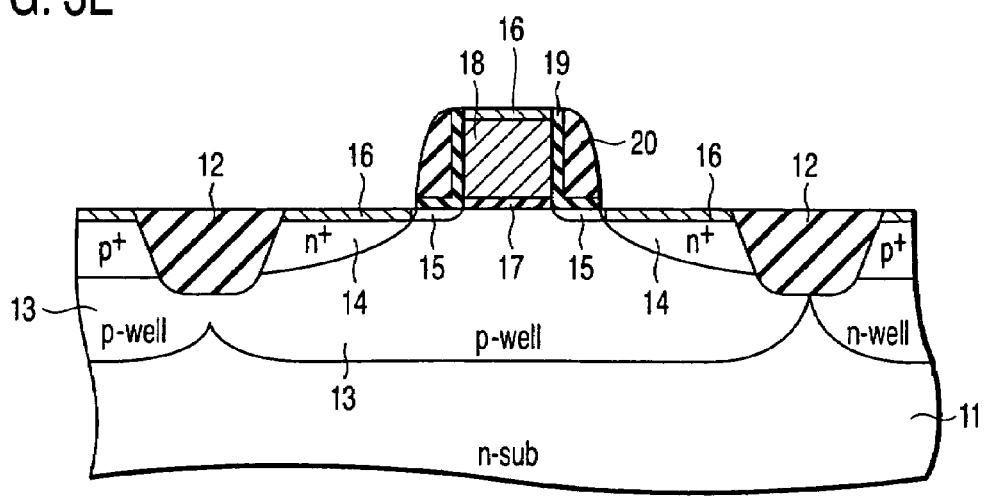

Then, after Ni is deposited on the entire surface by the sputtering method, the RTA process is performed for silicidation. The RTA process for silicidation is performed in a temperature range of 400° C. to 500° C., for example. After this, Ni which has not yet reacted is removed by a process using a mixed solution of sulfuric acid and hydrogen peroxide. Then, as shown in FIG. 3F, NiSi films 16 are formed on the surface portions of the pair of n$^-$-type diffusion regions 15 and the upper surface region of the gate electrode 18.

TiN can be deposited after Ni is deposited. Further, the non-reacted Ni is etched and removed by use of a mixed solution of sulfuric acid and hydrogen peroxide after the low-temperature RTA process is once performed at low temperatures of 250° C. to 400° C. Then, the RTA process of 400° C. to 500° C. is performed to lower the sheet resistance. Thus, a two-step annealing process can be performed.

Figure 3G:
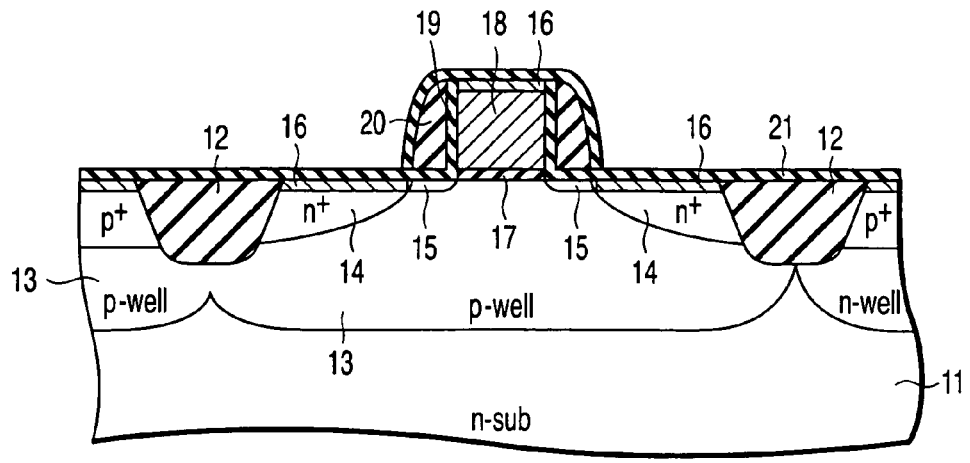

After this, as shown in FIG. 3G, a silicon nitride film 21 used as a contact liner film is deposited on the entire surface. The contact liner film is formed to prevent the NiSi films 16 from being dug by the RIE process when contact holes are formed in the later step and prevent junction leakage from being degraded. It is necessary that the contact liner film is a film having a high selective ratio at the time of RIE with respect to an inter-level insulating film deposited after this.

Figure 3H:
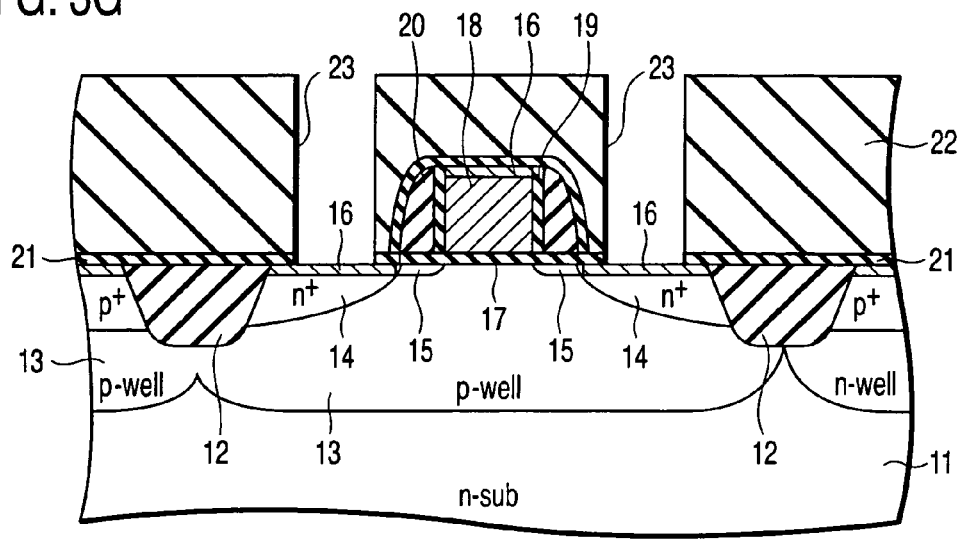

Next, as shown in FIG. 3H, an inter-level insulating film 22 formed of, for example, TEOS, BPSG, SiN or the like is deposited on the entire surface and the chemical and mechanical polishing (CMP) process is performed to make the surface flatten. Then, a photoresist is coated on the entire surface and patterned by the photolithography process, X-ray lithography process or electron beam lithography process to form a resist mask having openings in positions corresponding to the pair of NiSi films 16 on the source and drain regions. Next, the inter-level insulating film 22 and the silicon nitride film 21 lying under the inter-level insulating film are selectively etched and removed by the RIE process using the resist mask to form a pair of contact holes 23 which reach the surfaces of the pair of NiSi films 16 on the source and drain regions.

Figure 3I:
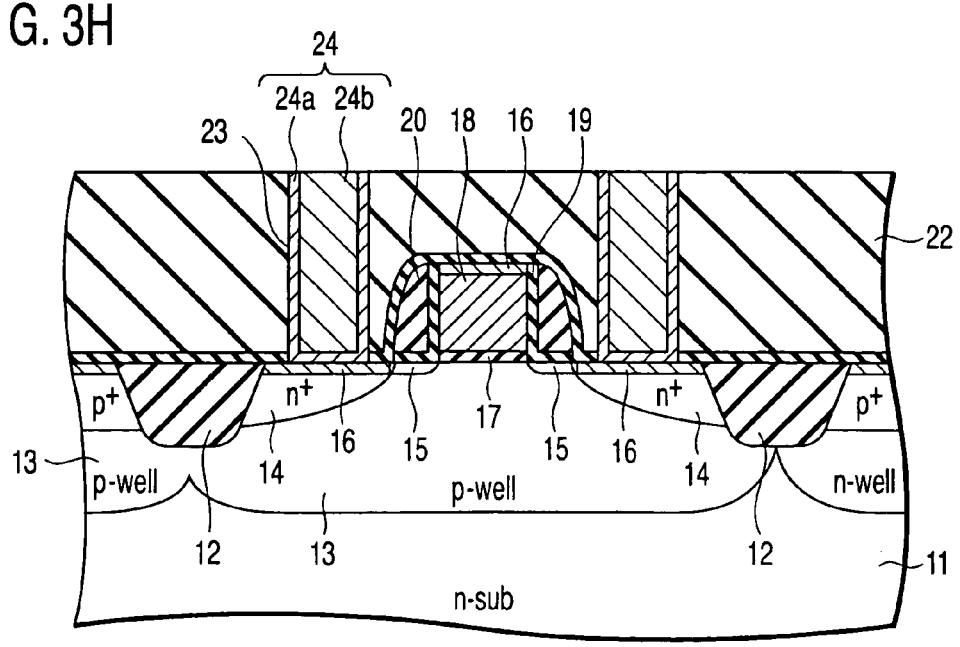

After this, as shown in FIG. 3I, for example, a barrier metal 24a formed of Ti or TiN is deposited on the entire surface containing the internal portion of each contact hole 23. Then, after selective growth of W or after a contact plug 24b is filled in each contact hole 23 in a blanket form, the CMP process is performed to form contact electrodes 24. Finally, after a metal film used as wirings is deposited, the metal film is patterned to form the wirings and thus a CMOS semiconductor device is completed.

According to the manufacturing method of the first embodiment, the p-type impurities of the B ions or $BF_2$ ions are doped from the surface of the NiSi film 16 in the depth direction and B or F is present in the surface region of the NiSi film 16. Therefore, in the NiSi film 16, formation of a compound formed of As, Ni, and O is suppressed and, as a result, the surface state of the NiSi film 16 can be improved. Thus, it becomes difficult to etch the NiSi film 16 when the inter-level insulating film 22 is selectively etched to form the contact holes 23. Further, separation of the silicon nitride film 21 used as the contact liner film formed on the NiSi film 16 can be prevented.

The p-type impurity of B or F is doped to provide a peak concentration of not lower than $1E20$ $cm^{-3}$ in a position at a depth of 30 nm from the surface of the NiSi film 16. Therefore, the surface state of the NiSi film 16 can be improved to attain the anti-etching property of the NiSi film 16 and the effect of prevention from separation of the silicon nitride film 21 used as the contact liner film formed on the NiSi film 16 to a fully satisfactory degree.

In addition, the p-type impurity of B or F is doped so that the impurity concentration in the interface between the NiSi film 16 and the $n^+$-type diffusion region 14 and in a position deeper than the interface will not become higher than $5E19$ $cm^{-3}$. Therefore, the n-type impurity concentration in the $n^+$-type diffusion region 14 lying under the NiSi film 16 can be kept sufficiently high and the resistance of the interface between the NiSi film 16 and the $n^+$-type diffusion region 14 can be lowered. By lowering the interface resistance, a rise in the parasitic resistances of the source and drain regions can be prevented.

Next, a manufacturing method of the second embodiment used when the semiconductor device of FIG. 1 is manufactured is explained.

In the manufacturing method of the first embodiment, one example is explained. In this example, the ion-implantation regions 14a used to form the $n^+$-type diffusion regions 14 are formed and then, for example, the B ions or $BF_2$ ions used as the p-type impurities are implanted into the entire surface portion of the NMOS transistor region. After this, the RTA process is performed to activate the ions implanted into the ion-implantation regions 14a so as to form the pair of $n^+$-type diffusion regions 14 and activate B or $BF_2$.

On the other hand, in the manufacturing method of the second embodiment, for example, B ions or $BF_2$ ions are implanted as the p-type impurities into the entire surface portion of the NMOS transistor region before forming the ion-implantation regions 14a shown in FIG. 3D. After this, the ion-implantation regions 14a are formed and then the RTA process is performed to activate the ions implanted into the ion-implantation regions 14a so as to form the pair of $n^+$-type diffusion regions 14 and activate B or $BF_2$.

That is, in the manufacturing method of the second embodiment, the order of implantation of the n-type impurity ions to form the $n^+$-type diffusion regions 14 and implantation of the p-type impurity ions to form an impurity profile shown by the curve "b" in FIG. 2 is reversed with respect to that in the manufacturing method of the first embodiment.

In the manufacturing method of the second embodiment, the same effect as that obtained in the manufacturing method of the first embodiment can be attained.

Next, a manufacturing method of the third embodiment used when the semiconductor device of FIG. 1 is manufactured is explained.

In the manufacturing method of the first embodiment, the ion-implantation regions 14a shown in FIG. 3D are not activated immediately after they are formed. Instead, after the B ions or $BF_2$ ions are implanted, the RTA process is performed to activate the ions implanted into the ion-implantation regions 14a so as to form the pair of $n^+$-type diffusion regions 14 and activate B or $BF_2$.

On the other hand, in the manufacturing method of the third embodiment, the RTA process is performed immediately after formation of the ion-implantation regions 14a shown in FIG. 3D to activate the implanted ions so as to form a pair of $n^+$-type diffusion regions 14 as shown in FIG. 4A.

Then, as shown in FIG. 4B, for example, B ions or $BF_2$ ions are implanted as the p-type impurities into the entire surface portion of the NMOS transistor region. As in the case of the method in the first and second embodiments, at the ion-implantation time, the implantation condition set when the B ions are used as the p-type impurity is that the acceleration voltage is 0.5 to 1.5 keV and the dose amount is $5.0E14$ to $1.0E15$ $cm^{-2}$. Further, when the $BF_2$ ions are used, the acceleration voltage is 5 to 10 keV and the dose amount is $5.0E14$ to $1.0E15$ $cm^{-2}$. By the above ion implantation, the substrate surface portion is formed into an amorphous form.

After this, the same process as that performed after the latter half of the step shown in FIG. 3E in the method of the first embodiment, that is, activation of the B ions or $BF_2$ ions, deposition of Ni, RTA for silicidation, deposition of a contact liner film (silicon nitride film 21), deposition of an inter-level insulating film 22, formation of contact holes 23 and formation of contact electrodes 24 are sequentially performed to form a CMOS semiconductor device.

In the manufacturing method of the third embodiment, the same effect as that of the manufacturing method in the first and second embodiments can be attained.

Further, in the manufacturing method of the third embodiment, the NiSi films 16 are formed while the substrate surface portion is formed in an amorphous form. Therefore, the effect of prevention from separation of the silicon nitride film 21 which is a contact liner film formed on the NiSi film 16 can be further enhanced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of a semiconductor device comprising:

doping n-type impurity ions into a selected portion of a surface region of a p-type silicon semiconductor region;

doping p-type impurity ions into portions of a surface region of the silicon semiconductor region;

activating the n-type and p-type impurity ions to form an n-type diffusion region in the surface region of the silicon semiconductor region and form a p-type diffusion layer in a depth direction of the silicon semiconductor region; and performing heat treatment to form a Ni silicide film in a surface region of the n-type diffusion region after depositing Ni on the surface region of the n-type diffusion region, wherein after formation of the Ni silicide film, the p-type diffusion layer has an impurity profile in which a peak concentration of not lower than 1E20 cm$^{-3}$ is provided in a preset depth position of the Ni suicide film and a concentration of the p-type diffusion layer in an interface between the Ni suicide film and the n-type diffusion region and a concentration of the p-type diffusion layer in a position deeper than the interface are not higher than 5E19 cm$^{-3}$.

2. A manufacturing method of the semiconductor device according to claim 1, wherein one of B and BF$_2$ ions is doped as the p-type impurity.

3. A manufacturing method of the semiconductor device according to claim 1, wherein the p-type impurity ions are doped to provide a peak concentration in a position at a depth of 30 nm from a surface of the Ni suicide film.

4. A manufacturing method of the semiconductor device according to claim 1, further comprising:
   forming a contact liner film on an entire surface of the silicon semiconductor region after forming the Ni silicide film;
   forming an inter-level insulating film on the entire surface;
   forming an opening portion which reaches the surface region of the n-type diffusion region in the inter-level insulating film and the contact liner film; and
   forming an electrode in contact with the surface region of the n-type diffusion region in the opening portion.

5. A manufacturing method of the semiconductor device according to claim 1, wherein the p-type ions are doped to provide a peak concentration in the Ni silicide film.

6. A manufacturing method of a semiconductor device comprising:
   doping p-type impurity ions into portions of a surface region of a p-type silicon semiconductor region;
   doping n-type impurity ions into a selected position of the surface region of the silicon semiconductor region;
   activating the p-type and n-type impurity ions to form a p-type diffusion layer in a depth direction of the silicon semiconductor region and form an n-type diffusion region on the surface portion of the silicon semiconductor region; and
   performing heat treatment to form a Ni silicide film on a surface region of the n-type diffusion region after depositing Ni on the surface region of the n-type diffusion region,
   wherein after formation of the Ni silicide film, the p-type diffusion layer has an impurity profile in which a peak concentration of not lower than 1E20 cm$^{-3}$ is provided in a preset depth position of the Ni silicide film and a concentration of the p-type diffusion layer in an interface between the Ni silicide film and the n-type diffusion region and the concentration of the p-type diffusion layer in a position deeper than the interface are not higher than 5E19 cm$^{-3}$.

7. A manufacturing method of the semiconductor device according to claim 6, wherein one of B and BF$_2$ ions is doped as the p-type impurity.

8. A manufacturing method of the semiconductor device according to claim 6, wherein the p-type impurity ions are doped to provide a peak concentration in a position at a depth of 30 nm from a surface of the Ni silicide film.

9. A manufacturing method of the semiconductor device according to claim 6, further comprising:
   forming a contact liner film an entire surface of the silicon semiconductor region after forming the Ni silicide film;
   forming an inter-level insulating film on the entire surface;
   forming an opening portion which reaches the surface region of the n-type diffusion region in the inter-level insulating film and the contact liner film; and
   forming an electrode in contact with the surface region of the n-type diffusion region in the opening portion.

10. A manufacturing method of the semiconductor device according to claim 6, wherein the p-type ions are doped to provide a peak concentration in the Ni suicide film.

11. A manufacturing method of a semiconductor device comprising:
   doping n-type impurity ions into a selected position of a surface region of a p-type silicon semiconductor region;
   activating the n-type impurity ions to form an n-type diffusion region on a surface portion of the silicon semiconductor region;
   doping p-type impurity ions into portions of a surface portion of the silicon semiconductor region to form the surface portion of the silicon semiconductor region in an amorphous form;
   activating the p-type impurity ions to form a p-type diffusion region in a depth direction of the silicon semiconductor region; and
   performing heat treatment to form a Ni silicide film on a surface region of the n-type diffusion region after depositing Ni on the surface region of the n-type diffusion region,
   wherein after formation of the Ni silicide film, the p-type diffusion layer has an impurity profile in which a peak concentration of not lower than 1E20 cm$^{-3}$ is provided in a preset depth position of the Ni silicide film and a concentration of the p-type diffusion layer in an interface between the Ni suicide film and the n-type diffusion region and the concentration of the p-type diffusion layer in a position deeper than the interface are not higher than 5E19 cm$^{-3}$.

12. A manufacturing method of the semiconductor device according to claim 11, wherein one of B and BF$_2$ ions is doped as the p-type impurity.

13. A manufacturing method of the semiconductor device according to claim 11, wherein the p-type impurity ions are doped to provide a peak concentration in a position at a depth of 30 nm from a surface of the Ni suicide film.

14. A manufacturing method of the semiconductor device according to claim 11, further comprising:
   forming a contact liner film on the entire surface after forming the Ni suicide film;
   forming an inter-level insulating film on the entire surface;
   forming an opening portion which reaches a surface of the n-type diffusion region in the inter-level insulating film and the contact liner film; and
   forming an electrode in contact with the surface of the n-type diffusion region in the opening portion.

15. A manufacturing method of the semiconductor device according to claim 11, wherein the p-type ions are doped to provide a peak concentration in the Ni suicide film.

* * * * *